US008969982B2

(12) United States Patent
Xiao et al.

(10) Patent No.: US 8,969,982 B2
(45) Date of Patent: Mar. 3, 2015

(54) BOTTOM ELECTRODE FOR MRAM DEVICE

(75) Inventors: Rongfu Xiao, Fremont, CA (US);
Cheng T. Horng, San Jose, CA (US);
Ru-Ying Tong, Los Gatos, CA (US);
Chyu-Jinh Torng, Pleasanton, CA (US);
Tom Zhong, Cupertino, CA (US);
Witold Kula, Cupertino, CA (US);
Terry Kin Ting Ko, Millbrae, CA (US);
Wei Cao, San Jose, CA (US); Wai-Ming J. Kan, San Ramon, CA (US); Liubo Hong, San Jose, CA (US)

(73) Assignee: Headway Technologies, Inc., Milpitas, CA (US)

( * ) Notice: Subject to any disclaimer, the term of this patent is extended or adjusted under 35 U.S.C. 154(b) by 185 days.

(21) Appl. No.: 12/927,670

(22) Filed: Nov. 19, 2010

(65) Prior Publication Data

US 2011/0133300 A1 Jun. 9, 2011

Related U.S. Application Data

(62) Division of application No. 11/528,877, filed on Sep. 28, 2006, now Pat. No. 7,838,436.

(51) Int. Cl.
*H01L 29/82* (2006.01)
*H01L 43/12* (2006.01)
*H01L 43/08* (2006.01)

(52) U.S. Cl.
CPC ............. *H01L 43/12* (2013.01); *H01L 43/08* (2013.01)
USPC .................... 257/421; 365/157; 257/E43.004

(58) Field of Classification Search
CPC .............................. H01L 27/226; H01L 43/10
USPC ....................... 257/421, E43.004; 365/157
See application file for complete search history.

(56) References Cited

U.S. PATENT DOCUMENTS

| | | | | |
|---|---|---|---|---|
| 6,703,654 | B1 * | 3/2004 | Horng et al. ................... | 257/295 |
| 6,713,801 | B1 * | 3/2004 | Sin et al. ......................... | 257/295 |
| 6,960,480 | B1 * | 11/2005 | Horng et al. ...................... | 438/3 |
| 6,974,708 | B2 | 12/2005 | Horng et al. | |
| 7,060,194 | B2 | 6/2006 | Kodaira et al. | |
| 7,102,858 | B2 * | 9/2006 | Takahashi et al. ............ | 360/322 |
| 7,112,861 | B2 * | 9/2006 | Kanakasabapathy et al. ............................... | 257/421 |
| 7,122,852 | B2 | 10/2006 | Horng et al. | |
| 7,265,404 | B2 | 9/2007 | Cao et al. | |
| 7,611,912 | B2 | 11/2009 | Hong et al. | |
| 7,880,249 | B2 * | 2/2011 | Yuan et al. ..................... | 257/421 |
| 2002/0008946 | A1 * | 1/2002 | Noma ....................... | 360/324.11 |
| 2006/0054947 | A1 * | 3/2006 | Asao et al. .................... | 257/295 |
| 2007/0268743 | A1 * | 11/2007 | Daughton et al. ............. | 365/173 |
| 2008/0068764 | A1 * | 3/2008 | Fukuzawa et al. .......... | 360/324.1 |
| 2008/0068767 | A1 * | 3/2008 | Nakabayashi et al. ... | 360/324.11 |
| 2010/0047929 | A1 * | 2/2010 | Hong et al. ....................... | 438/3 |
| 2011/0014400 | A1 * | 1/2011 | Huang et al. .................. | 427/597 |

OTHER PUBLICATIONS

S. Tehrani et al., "Magnetoresistive Random Access Memory Using Magnetic Tunnel Junctions," Proceedings of the IEEE, vol. 91, No. 5, May 2003, pp. 703-712.
"Nanoscale MRAM Elements," (including an extensive review of RIE),—S.J. Peraton and J.R. Childress (IBM and U of F), pp. 1-55, found: http://mse.ufl.edu/~spear/recent_papers/NanoscaleMRAM/NanoscaleMRAM.htm, on Jul. 13, 2005.

* cited by examiner

*Primary Examiner* — Caridad Everhart
(74) *Attorney, Agent, or Firm* — Saile Ackerman LLC; Stephen B. Ackerman; Rosemary L.S. Pike

(57) ABSTRACT

A multi-layered bottom electrode for an MTJ device on a silicon nitride substrate is described. It comprises a bilayer of alpha tantalum on ruthenium which in turn lies on a nickel chrome layer over a second tantalum layer.

7 Claims, 5 Drawing Sheets

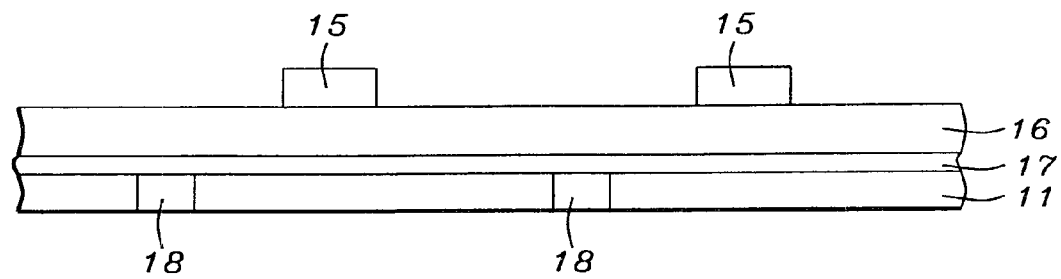
Prior Art — FIG. 1a
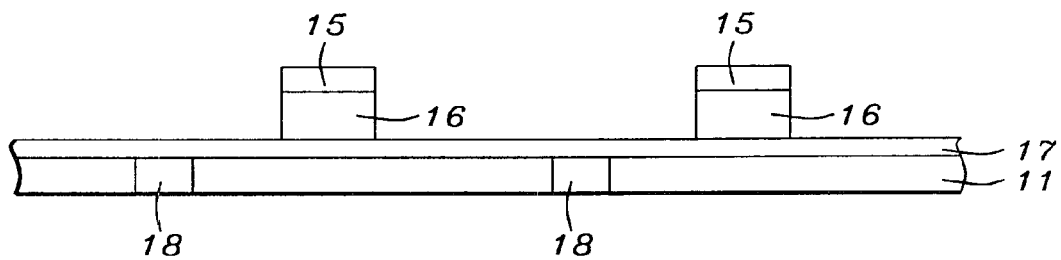
Prior Art — FIG. 1b
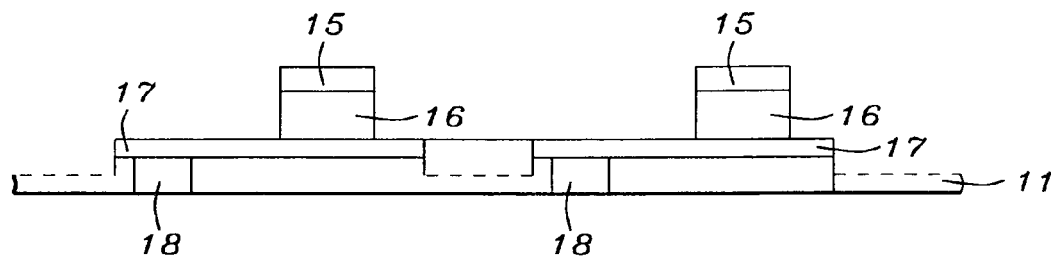
Prior Art — FIG. 1c

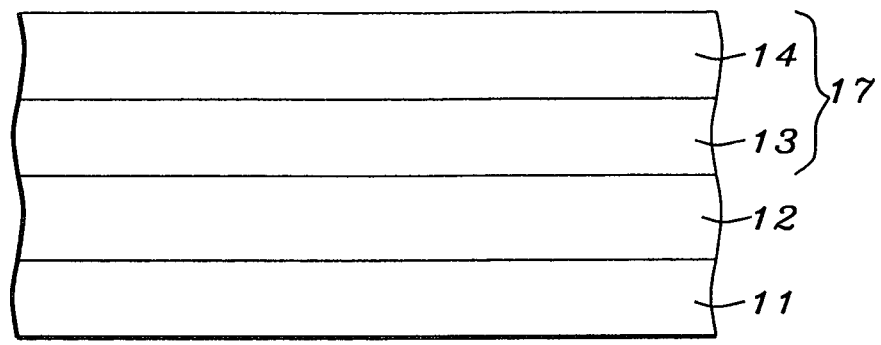
FIG. 2 – Prior Art
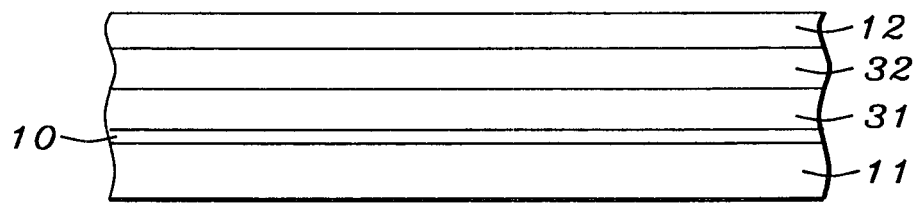
FIG. 3
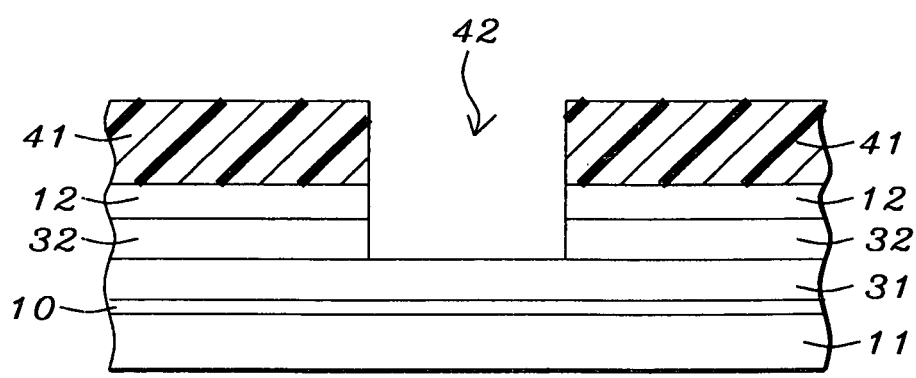
FIG. 4

BOTTOM ELECTRODE FOR MRAM DEVICE

This is a divisional application of U.S. patent application Ser. No. 11/528,877, filed on Sep. 28, 2006, which is herein incorporated by reference in its entirety, and assigned to a common assignee.

This application is related to U.S. patent application Ser. No. 11/215,276, filed on Aug. 30, 2005 and since issued as U.S. Pat. No. 7,265,404 on Sep. 4, 2007, and herein incorporated, by reference, in its entirety.

FIELD OF THE INVENTION

The invention relates to the general field of magnetic tunnel junctions (MTJs) with particular reference to the bottom electrode located between them and the inter-layer dielectric (ILD) of an integrated circuit.

BACKGROUND OF THE INVENTION

Magnetoresistive Random Access Memory (MRAM), based on the integration of silicon CMOS with Magnetic Tunnel Junction (MTJ)s, is a major emerging technology, highly competitive with existing semiconductor memories (SRAM, DRAM, Flash etc). The MTJ consists of two ferromagnetic layers separated by a thin dielectric layer. Magnetization of the two ferromagnetic layers can be arranged to be in either parallel (low resistance) or anti-parallel (high resistance) magnetization states, representing "1" and "0" respectively, The MTJ memory cells are usually inserted at the back end of a standard CMOS process. The high-speed version of MRAM architecture consists of a cell with an access transistor and a MTJ (1T1MTJ) in the array. The MTJ element is formed on top of the bottom conductor line, which is used to connect the base of the MTJ to the access transistor. Switching of the free layer magnetization in the MTJ device is accomplished by applying currents to orthogonal conductor lines.

The conductors are arranged in a cross-point architecture that provides the field for selectively switching each bit. One line (bit line) provides the field parallel to the easy axis of the bit, while another line (write word line) provides the perpendicular (hard axis) component of the field. The intersection of the lines generates a peak field that is engineered to be just above the switching threshold of that MTJ. For high performance MTJ devices, the separation between the write word line (bit line) and MTJ free layer is made as small as possible.

In a read operation, the read word line (RWL) is selected, and the transistor is turned on. This causes the MTJ device to be connected to ground. At this time, a sense current passes through the BL-MTJ-BE and to ground. The resistance of the MTJ device is low when the MTJ is storing a 1 and high when it is storing a 0.

Referring now to FIG. 1a, shown there is tantalum hard mask 15 which will be used to separate MTJ sheet stack 16 into individual devices, each resting on a bottom electrode that comprises material from layer 17 which rests on SiN ILD 11. Also seen (though not relevant to the invention) are vias 18. In FIG. 1b, layer 16 has been patterned into individual MTJ devices 4, with Ta mask 15 having been partly consumed during the etch operation. In FIG. 1c bottom electrode layer 17 has also been patterned into individual electrodes. However, in the course of making certain that said electrodes are truly electrically isolated one from another, ILD layer has been over etched so that its top surface has been partly eroded, as symbolized by its being shown as a broken line in the figure.

Reactive ion etching (RIE) has been preferred over IBE (ion beam etching) as the method for etching layer 17. However, vertical features created by IBE always have an extended slope on the edge, which not only could creates electrical shorting problems but also limits further reduction of line width and make it impossible to make very high density IC device. In general, RIE is considered a better approach to creating well-defined three dimensional microfeatures but there are several major problems currently associated with the RIE process:

(1) The uncontrollable over etch mentioned above is due to the lack of etching selectivity between the bottom electrode and the ILD. FIG. 2 illustrates the structure of layer 17 in greater detail—immediately on ILD 11 is TaN layer 12 on which is alpha tantalum layer 13. Layer 14 comprises a second TaN layer.

(2) This etching process always results in a large amount of re-deposition all over the surface of the device due to the non-volatility of the reaction products.

(3) The MTJ will experience two etching processes (first in its own etch and then during the BE etch). This not only affects the MTJ's overall dimensions, but also results in serious damage to the edge of the MTJ's tunnel barrier layer.

A routine search of the prior art was performed with the following references of interest being found:

U.S. Pat. No. 6,974,708 (Horng et al) discloses OSL on top of the bottom electrode.

U.S. Pat. No. 6,703,654 (Horng et al) teaches a NiCr/Ru bottom electrode.

U.S. Pat. No. 6,960,480 (Horng et al) discloses a bottom electrode of /NiCr/Ru/α-Ta.

U.S. Patent Application 2005/0254293 (Horng et al) teaches layers comprising NiCr/Ru/αTa.

U.S. Patent Application 2005/0016957 (Kodaira et al), the Anelva Co., shows dry etching using $CH_3OH$.

U.S. Patent Application 2006/0002184 (Hong et al) teaches bottom electrodes of NiCr/Ru/Ta or NiCr/Ru/α-TaN.

Additional References of Interest are:

1. S. Tehrani. et. al. "Magnetoresistive Random Acess Memory using Magnetic tunnel junction" Proceeding of the IEEE. Vol. 91, p 703-712, 2003.
2. C. Horng et. al. HTO3-022 "A novel structure/method to fabricate a high performance magnetic tunneling junction MRAM". Magic touch and NiCr/Ru/alpha-Ta.
3. "Nanoscale MRAM elements" (including an extensive review of RIE),—S. J. Peraton and J. R. Childress (IBM and U of F).

SUMMARY OF THE INVENTION

It has been an object of at least one embodiment of the present invention to provide a process for forming a bottom electrode for an MTJ stack on a silicon nitride substrate in such a way as to minimize any possible surface damage to said substrate.

A further object of at least one embodiment of the present invention has been that said substrate also serve as an ILD of an associated integrated circuit and that said ILD have a thickness no greater than about 500 Å thereby facilitating it proximity to a word line of said integrated circuit.

Another object of at least one embodiment of the present invention has been that said bottom electrode have good electrical conductance.

Still another object of at least one embodiment of the present invention has been that said MTJ stack have vertical, or near vertical, sidewalls and be spaced no more than about 0.3 microns from neighboring MTJ stacks.

Yet another object of at least one embodiment of the present invention has been that said process not damage the edges of the tunnel barriers of said MTJ stacks.

These objects have been achieved by including a layer of ruthenium as one of the layers that make up the bottom electrode. The ruthenium serves two purposes. First, it is a good electrical conductor. Second, it responds differently from Ta and TaN to certain etchants that may be used to perform RIE. Specifically, ruthenium etches much more slowly than Ta or TaN when exposed to $CF_4$ while the reverse is true when $CH_3OH$ is used. Furthermore, silicon nitride is largely immune to corrosion by $CH_3OH$, so removal of a ruthenium layer at, or near, the silicon nitride surface can be safely performed.

This differential etch behavior allows an included layer of ruthenium to be used as an etch stop layer during the etching of Ta and/or TaN while the latter materials may be used to form a hard mask for etching the ruthenium.

A problem of the prior art has been the relatively poor adhesion of ruthenium to silicon nitride. This problem has been overcome by inserting a bilayer of NiCr on TaN as the 'glue' between the Ru and the SiN.

BRIEF DESCRIPTION OF THE DRAWINGS

FIGS. 1a-1c show the prior art process for forming a bottom electrode for an MTJ stack.

FIG. 2 illustrates the layer structure of an MTJ bottom electrode of the prior art.

FIG. 3 illustrates the layer structure of an MTJ bottom electrode as used in the first embodiment of the present invention.

FIG. 4 shows the structure seen in FIG. 3 after $CF_4$ etching during which the Ru layer acts as an etch stop.

DESCRIPTION OF THE PREFERRED EMBODIMENTS

Figure 5:
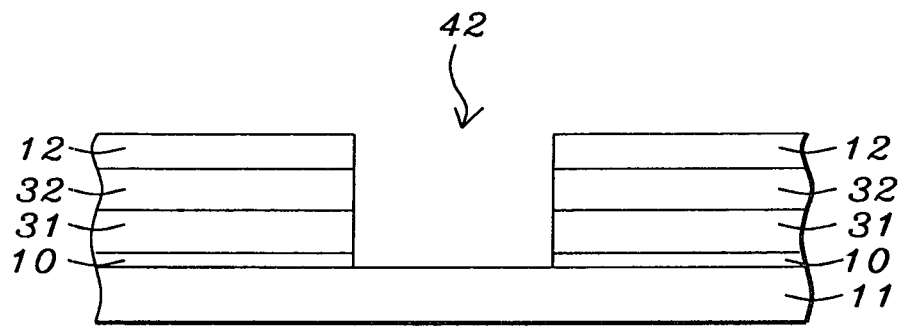
FIG. 5 shows the structure seen in FIG. 4 after $CH_3OH$ etching to remove Ru with minimum corrosion of the SiN substrate.

The invention discloses a novel bottom conductor layer structure that is smooth, flat, and has low resistance. In the first embodiment, the bottom conductor layer structure is NiCr30/Ru20/α-Ta120/TaN150. In the second embodiment, the bottom conductor layer structure is typically TaN/NiCr3/Ru30/α-Ta120/TaN150. The total thickness of these bottom conductor structures is 300 Å (as in the prior art). RIE of these bottom conductor layers is first achieved using an etchant of the $CF_4$ type to remove the top TaN/Ta layer, which is followed by an etchant of the $CH_3OH$ type to etch the ruthenium.

In MTJ structures, topological roughness of the magnetic layers causes ferromagnetic coupling (Neel coupling) to shift the hysteresis loop. To minimize this inter-layer coupling effect, it is critical to form the MTJ stack on a flat/smooth bottom conductor. An example of a MTJ configuration that results in a high performance MTJ is:

SiN/TaN/NiCr45/Ru100/Ta150/S.E./NiCr5O/MnPt150/CoFe20/Ru7.5/CoFeB21/AlOx(10-15)/NiFe35/CAP.

|< BE <| |< MTJ stack >| where S.E.=sputter etch

It is known that Ta formed on top of Ru grows in its a low resistance alpha-Ta phase. The high performance MTJ is formed on top of NiCr50/Ru100/Ta150 bottom conductor. The disclosed NiCr30/Ru20/Ta100/TaN150 bottom conductor of this invention is very flat and smooth (typically having a roughness value less than about 2 Å). The TaN150 cap is used here to protect Ta from oxidation. For the process to yield a high performance MTJ, this TaN cap is sputter-etched to a 30 Å thickness of the exposed TaN top layer.

When using a photoresist mask, the etching selectivity for Ta (TaN)/Ru by $CF_4$-RIE is around 10. Thus in the process of using RIE to pattern the NiCr30/Ru30/Ta100/TaN150 bottom conductor, the top Ta/TaN is subjected to $CF_4$ gas chemistry which is largely ineffective at the Ru surface. After photoresist strip, the etchant is then changed to $CH_3OH$ to etch the remaining Ru/NiCr. Ru etch rate is about same as SiN and NiCr etch rate is about 0.5 of SiN. Since the NiCr/Ru seed layer is much thinner than ILD SiN (50 Å vs 300 Å), even with a 100% over-etch of the Ru30/NiCr30 layers, over-etching into the SiN would amount to less than 50 Å. In contrast, for $CF_4$-RIE of the TaN50/Ta100/TaN150 (as used in the prior art), a 100% over-etch would result in the removal of over 300 Å of the SiN ILD.

For the first embodiment, as an alternative to the use of NiCr as a 'glue' layer, a special treatment of the SiN substrate surface may be used instead:

Sputter-clean SiN/OSL/Ru30/α-Ta120/TaN150 where OSL stands for oxygen surfactant layer. When OSL is used to treat the SiN surface, SiOxyNitride/RuO is formed at the SiN/Ru interface which then promotes good adhesion.

We now provide a description of the processes used to manufacture the two embodiments of the invention:

$1^{st}$ Embodiment

Referring now to FIG. 3, the process starts with sputter cleaning of the surface of substrate layer 11, followed by depositing thereon layer of NiCr 10 onto which is deposited ruthenium layer 31 to a thickness between about 20 and 30 Angstroms. This is followed by the deposition, to a thickness between about 100 and 200 Angstroms, of alpha tantalum layer 32 (on ruthenium layer 31). Next, tantalum nitride layer 12 is deposited on layer of alpha tantalum 32 (to a thickness between about 100 and 150 Angstroms).

Now follows a critical feature of the invention which is the process used to etch the bottom electrode sheet (layers 12/32/

31/11) into individual bottom electrodes without, at the same time, significantly penetrating silicon nitride substrate 11. This is accomplished in two main steps, as follows:

Referring now to FIG. 4, photoresist mask 41, that defines the required multiple electrode shapes, is formed on the upper surface of layer 12. Then, a first reactive ion etching step is performed, using as the etchant one of several possible gaseous compounds of carbon and fluorine, such as CF4, $CHF_3$ etc., with $CF_4$ being preferred. Etching of all unprotected areas now proceeds at a rate of about 80 nm/min. and layers 12, and 32 are successively removed (where there is no photoresist). When however, layer 31 of ruthenium becomes exposed, the etch rate falls off substantially—typically by a factor of about one $10^{th}$, at which point reactive ion etching may be terminated "at leisure" with no danger of etching through ruthenium layer 31 and penetrating silicon nitride substrate 11. The appearance of the structure is now as shown in FIG. 4 with arrow 42 pointing to the region of separation between two individual bottom electrodes.

Now moving to FIG. 5, all remaining photoresist has been removed. At this point a second reactive ion etching process is initiated. In this case the etchant used is one of several possible gaseous compounds of carbon, oxygen, and hydrogen, such as $CH_3OH$, $CO+N\ H_3$, $C_2H_5OH$, etc., with $CH_3OH$ being preferred. No additional photoresist is required. Instead the previously etched layer 12 acts as a hard mask during the etching of layers 31 and 10. Etching of all exposed ruthenium surfaces now proceeds at a rate of about 8 nm/min. until silicon nitride layer 11 is exposed, at which point the second reactive ion etching process may be terminated, also "at leisure", with no danger of penetrating silicon nitride substrate 11 by more than about 60 Angstroms. The appearance of the structure is now as shown in FIG. 5.

$2^{nd}$ Embodiment

Figure 6:
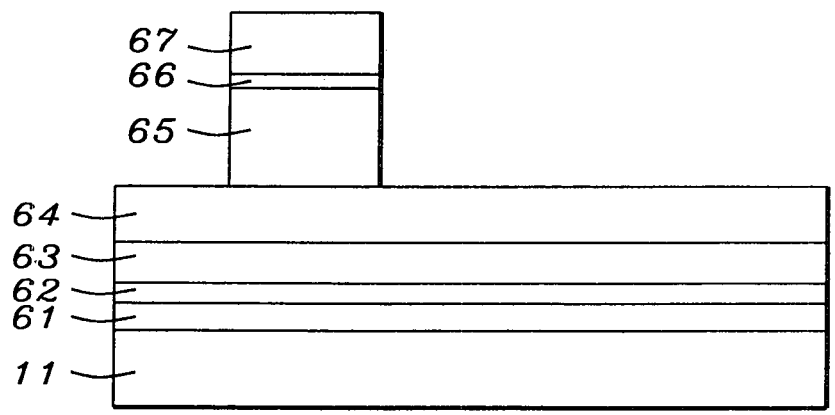
FIG. 6 shows the starting point for the process of the second embodiment of the invention.

Referring now to FIG. 6, the process of the $2^{nd}$ embodiment starts with sputter cleaning of the surface of SiN substrate layer 11 onto which is deposited layer of tantalum nitride 61 to a thickness between about 20 and 30 Angstroms. This is immediately followed by the deposition (onto the top surface of 61) of layer 62 of NiCr to a thickness between about 20 and 30 Angstroms. Note that it is critical for the effectiveness of this embodiment that layers 61 and 62 always be used together. The motivation for this is the excellent adhesion of TaN to SiN, the excellent adhesion of NiCr to TaN, and the excellent adhesion of Ru to NiCr. Furthermore, NiCr is an effective seed layer for Ru so it also serves to minimize the resistivity of Ru layer 63.

Next, layer 63 of ruthenium is deposited on layer 62 and then alpha tantalum layer 64 is deposited on ruthenium layer 63. Layers 61-64 now constitute a base layer on which MTJ devices can be formed. Seen in FIG. 6 are pinned layer substack 65, insulator tunneling layer 66 and free layer/capping layers 67. The individual MTJ devices are formed by etching layers 65-67 (under a tantalum hard mask) by means of $CF_4$—$CH_3OH$, which etching process stops when alpha tantalum layer 64 is reached. The appearance of the structure after the individual MTJ devices have been formed is as illustrated in FIG. 6.

Figure 7:
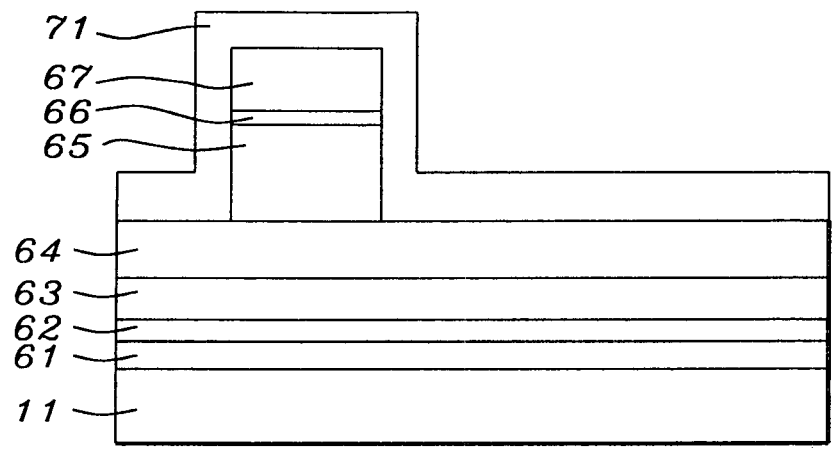
FIG. 7 illustrates a key feature of the second embodiment, namely a protective coating that is partly consumed during etching of the alpha tantalum portion of the bottom electrode.
Figure 8:
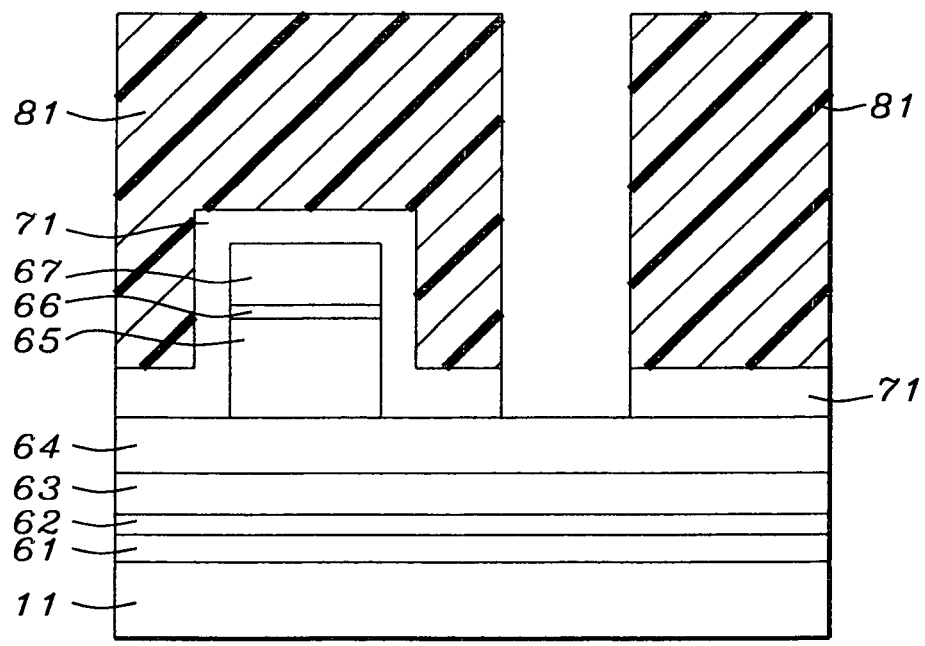
FIG. 8 illustrates the patterning of the protective coating prior to etching down to the level of the ruthenium.

Referring next to FIG. 7, following the formation of the MTJ devices they are coated with conformal continuous layer 71 of a material known to protect the MTJ junction during the bottom electrode etch that follows. Suitable materials for this layer include $SiO_2$, SiN, and $SiN/SiO_2$, with $SiO_2$ being preferred. Moving on to FIG. 8, once layer 71 is in place, photoresist layer 81 is applied over the entire surface and patterned so as to define the individual bottom electrodes, following which this pattern is transferred to layer 71 by etching its unprotected areas.

Figure 9:
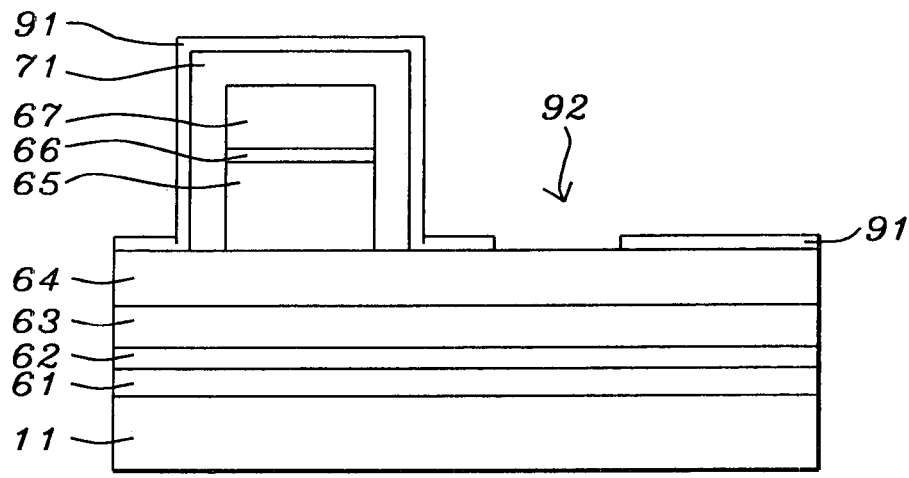
FIGS. 9 and 10 show the final process steps whereby the SiN substrate on which the bottom electrodes lies suffers minimal corrosion after it is exposed and, furthermore, an amount of the protective coating is still present and is thus able to provide permanent protection to the structure.

As shown in FIG. 9, once all photoresist has been removed layer 71 becomes a hard mask suitable for etching alpha tantalum layer 64. This is accomplished by means of a first RIE process based on one of several possible gaseous compounds of carbon and fluorine, such as $CF_4$ and $CHF_3$, with $CF_4$ being preferred. Note that, although it serves as a hard mask, a certain amount of layer 71 is removed by this etching process. It follows that the initial thickness of layer 71 is critical as it should be thin enough to provide good spatial resolution of the etched parts but thick enough so that there is always present a sufficient thickness to protect the areas that underlie it. This minimum remaining thickness should be about 600 Angstroms.

Figure 10:
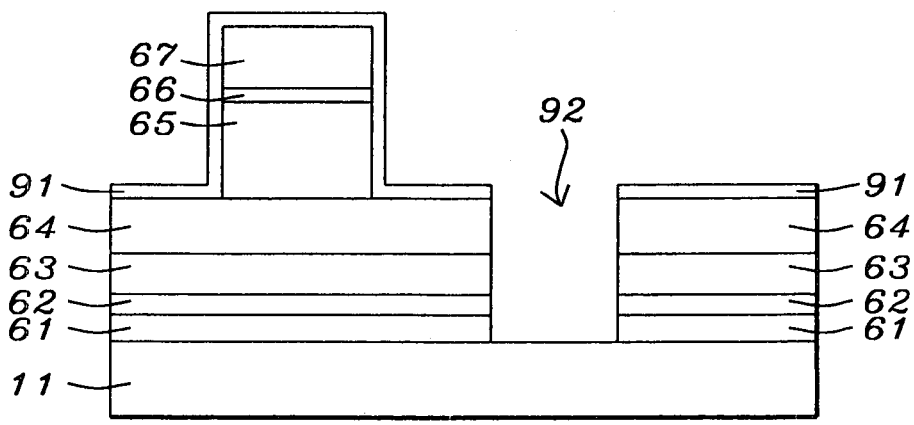

When layer 63 of ruthenium becomes exposed, the etch rate falls off substantially—typically by a factor of about 10, at which point first reactive ion etching may be terminated "at leisure" with no danger of etching through ruthenium layer 63 and penetrating silicon nitride substrate 11. The appearance of the structure is now as shown in FIG. 9 with arrow 92 pointing to the region of separation between two individual bottom electrodes As shown in FIG. 10, the remains of layers 64 and 71, the latter now being designated as layer 91, now serve as a hard mask for the removal of unprotected areas of ruthenium layer 63, as well as layers 62 and 61, by means of a second RIE process. The etchant used in the second reactive ion etching process is one of several possible gaseous compounds of carbon, oxygen, and hydrogen such as $CO+NH_3$, $CH_3OH$, and $C_2H_5OH$, with $CH_3OH$ being preferred. Once all exposed ruthenium has been removed, the etch rate drops by a factor of about ⅔ when silicon nitride substrate 11 becomes exposed, at which point the second reactive ion etching process may be terminated with minimal penetration of the silicon nitride substrate and with a non-zero thickness of conformal continuous layer 91 (i.e. the remains of layer 71) still present. This remnant layer 91 can now serve as a protective layer for the structure.

In summary, the advantages of the invention include:
(a) It results in a well defined vertical profile for each MTJ
(b) It avoids re-deposition of etching by-products on the device surface
(c) It avoids any extensive over etching of the underlying thin SiN ILD.
(d) it avoids possible exposure of the underlying Cu word line, thereby avoiding Cu corrosion by the etching chemicals
(e) It provides an easily controlled manufacturing scheme for the bottom electrode layer of an MRAM device.
(f) It solves the problem of weak adhesion between the BE and ILD
(g) It provides a BE with good electrical conduction
(h) It protects the exposed MTJ junction during BE etch.

What is claimed is:
1. A bottom electrode for an MTJ device on a silicon nitride substrate having a top surface, comprising:
on said top surface, a bilayer that comprises a nickel chrome portion on a tantalum containing portion;
a layer of ruthenium on said bilayer;
a layer of alpha tantalum on said ruthenium layer wherein said alpha tantalum layer has a roughness value that is no greater than about 5 Angstroms;
said MTJ device being on said alpha tantalum layer; and
a protective layer that covers said MTJ device.
2. The bottom electrode described in claim 1 wherein said tantalum containing portion is tantalum or tantalum nitride.

3. The bottom electrode described in claim 2 wherein said nickel chrome portion has a thickness between about 20 and 30 Angstroms.

4. The bottom electrode described in claim 2 wherein said tantalum containing portion has a thickness between about 20 and 50 Angstroms.

5. The bottom electrode described in claim 2 wherein said protective layer is selected from the group consisting of $SiO_2$, SiN, and SiON and has a thickness between about 500 and 1,500 Angstroms.

6. The bottom electrode described in claim 2 wherein said ruthenium layer has a thickness between about 30 and 100 Angstroms.

7. The bottom electrode described in claim 2 wherein said alpha tantalum layer has a thickness between about 100 and 150 Angstroms.

* * * * *